United States Patent
Gilda et al.

(10) Patent No.: US 10,833,707 B2
(45) Date of Patent: Nov. 10, 2020

(54) ERROR TRAPPING IN MEMORY STRUCTURES

(71) Applicant: INTERNATIONAL BUSINESS MACHINES CORPORATION, Armonk, NY (US)

(72) Inventors: Glenn Gilda, Binghamton, NY (US); Arthur O'Neill, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/273,370

(22) Filed: Feb. 12, 2019

(65) Prior Publication Data
US 2020/0259506 A1 Aug. 13, 2020

(51) Int. Cl.
*G11C 29/52* (2006.01)
*H03M 13/17* (2006.01)
*G06F 11/10* (2006.01)
*H03M 13/15* (2006.01)

(52) U.S. Cl.
CPC ....... *H03M 13/175* (2013.01); *G06F 11/1004* (2013.01); *H03M 13/1575* (2013.01)

(58) Field of Classification Search
CPC ............ H03M 13/175; H03M 13/1575; G06F 11/1004
USPC ........................................................ 714/762
See application file for complete search history.

(56) References Cited

U.S. PATENT DOCUMENTS

| 4,866,604 | A | * | 9/1989 | Reid | G06F 11/1616 713/600 |
| 5,659,557 | A | * | 8/1997 | Glover | G11B 20/1833 714/752 |
| 5,727,003 | A | * | 3/1998 | Zook | G11B 20/1833 714/758 |
| 7,502,986 | B2 | | 3/2009 | O'Neill et al. | |
| 8,055,828 | B2 | | 11/2011 | Conti et al. | |

(Continued)

OTHER PUBLICATIONS

Disclosed Anonymously "A Way to Compare Against an Array's Output Data Earlier by Comparing Against the Array's Read Address", IP.com No. IPCOM000225279D; Publication Date: Feb. 5, 2013; 7 pgs.

(Continued)

*Primary Examiner* — Albert Decady
*Assistant Examiner* — Enam Ahmed
(74) *Attorney, Agent, or Firm* — Cantor Colburn LLP; William Kinnaman (57) ABSTRACT

Embodiments include methods, systems and circuits for operating an error trapping logic circuit in a memory device. Aspects include receiving, during a first clock cycle, data and check bits for the data from a memory location and determining, during the first clock cycle, whether the data includes any error by calculating an error syndrome from the data and the check bits. Aspects also include determining, during a second clock cycle, a type of the error based on a full decoding of the error syndrome. Aspects further include determining whether to store the data, the check bits and the error syndrome in trap registers of the error trapping logic circuit based on an operating mode of the error trapping logic circuit and the type of the error.

18 Claims, 6 Drawing Sheets

(56) References Cited

U.S. PATENT DOCUMENTS

| | | | |
|---|---|---|---|
| 8,055,975 B2* | 11/2011 | Lilly | H03M 13/09 |
| | | | 714/758 |
| 8,069,290 B2 | 11/2011 | Conti et al. | |
| 8,316,284 B2 | 11/2012 | O'Neill et al. | |
| 8,347,012 B2 | 1/2013 | Goss et al. | |
| 8,375,148 B2 | 2/2013 | Watanabe | |
| 8,423,875 B2 | 4/2013 | O'Neill et al. | |
| 8,745,465 B1* | 6/2014 | Aligave | G11C 29/52 |
| | | | 714/762 |
| 9,207,747 B2 | 12/2015 | Lewis | |
| 2009/0187808 A1* | 7/2009 | Nichols | H03M 13/175 |
| | | | 714/762 |
| 2010/0115383 A1* | 5/2010 | Toda | H03M 13/1575 |
| | | | 714/785 |
| 2015/0007001 A1* | 1/2015 | Kern | H03M 13/616 |
| | | | 714/785 |
| 2015/0089333 A1* | 3/2015 | Hosp | G06F 11/1004 |
| | | | 714/807 |
| 2016/0239375 A1* | 8/2016 | Fee | G06F 3/0679 |

OTHER PUBLICATIONS

Jaleel, Aamer et al. "Using Virtual Load/Store Queues (VLSQs) to Reduce the Negative Effects of Reordered Memory Instructions", Proceedings of the 11th Int'l Symposium on High-Performance Computer Architecture (HPCA-11 2005); 2005 IEEE, 10 pgs.

Khandelwal, Atul "Pre-staging a Virtual Machine (VM) with References to a Maximum Number of Data Blocks on a Local Datastore for Faster VM Restores", Symantec Corporation; IP.com No. IPCOM000226889D; Publication Date: Apr. 23, 2013; 6 pgs.

* cited by examiner

ERROR TRAPPING IN MEMORY STRUCTURES

BACKGROUND

The present techniques relate to capturing error data in memory structures. More specifically, the techniques relate to trapping errors in structures.

Large, dense memory structures in systems such as L3 cache are inherently prone to errors. As a result, error correction codes are used to mitigate against loss of data. In addition, the debugging of failures detected by error correction codes in such structures is used to isolate failure modes for taking remedial action and possibly preventing system outages. Trap registers, or registers that are used to store error data, are provided in dense memory structures to facilitate this debug capability. Numerous copies of these trap registers are used to capture information within memory banks, sections or other divisions of these memory structures.

Access to large memory structures is typically pipelined because memory accesses and error correction take multiple clock cycles to complete. This pipeline can contain several data beats, each of which can contain an error. The pipelining adds several register stages for each trap register, which significantly increases the power dissipation of the memory structure. In addition, information on when an error should be captured in the trap registers is not known until later in the pipeline. For example, accesses to the memory can be started speculatively and then later canceled.

SUMMARY

According to an embodiment described herein, a memory device having a plurality of memory banks each including a plurality of memory sections configured to store data is provided. Each of the plurality of memory sections includes an error trapping logic circuit. The error trapping logic circuit is configured to receive, during a first clock cycle, data and check bits read from a memory section and to determine, during the first clock cycle, whether the data includes any error by calculating an error syndrome from the data and check bits. The error trapping logic circuit is also configured to determine, during a second clock cycle, a type of the error based on a full decoding of the error syndrome to determine whether to store the data, check bits and error syndrome in trap registers of the trapping logic circuit based on an operating mode of the error trapping circuit and the type of the error.

According to another embodiment described herein, a method for operating an error trapping circuit in a memory device is provided. The method includes receiving, during a first clock cycle, data and check bits for the data from a memory location. The method also includes determining, during the first clock cycle, whether the data includes any error by calculating an error syndrome from the data and the check bits. The method further includes determining, during a second clock cycle, a type of the error based on a full decoding of the error syndrome. The method also includes determining whether to store the data, the check bits and the error syndrome in trap registers of the error trapping logic circuit based on an operating mode of the error trapping logic circuit and the type of the error.

According to an embodiment described herein, an error trapping logic circuit is provided. The error trapping logic circuit is configured to receive, during a first clock cycle, data and check bits read from a memory section and to determine, during the first clock cycle, whether the data includes any error by calculating an error syndrome from the data and check bits. The error trapping logic circuit is also configured to determine, during a second clock cycle, a type of the error based on a full decoding of the error syndrome to determine whether to store the data, check bits and error syndrome in trap registers of the trapping logic circuit based on an operating mode of the error trapping circuit and the type of the error.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

DETAILED DESCRIPTION

Embodiments of methods, systems, and circuits for trapping error data in large memory structures are provided, with exemplary embodiments being discussed below in detail. In exemplary embodiments, the number of staging registers that are required to perform trapping of error data in memory structures is reduced, thereby reducing the power dissipation of the memory structures. In exemplary embodiments, error trapping logic circuits are used to control the operation of a set of staging registers to conditionally hold data read from the memory and associated ECC (error correction code) data until the status for updating the error trapping registers is known.

In exemplary embodiments, the error trapping logic is configured to utilize a simplified error detection algorithm to determine whether data obtained from the memory structure includes an error. It is performed here by looking for a non-zero error syndrome. The error detection algorithm is able to determine if an error is present during the clock cycle that the data is obtained from the memory. However, it cannot determine a type of a detected error, i.e., whether the error is a correctable error or an uncorrectable error, during the single clock cycle. The simplified error detection algorithm is referred to herein as an xe decode.

Figure 1:
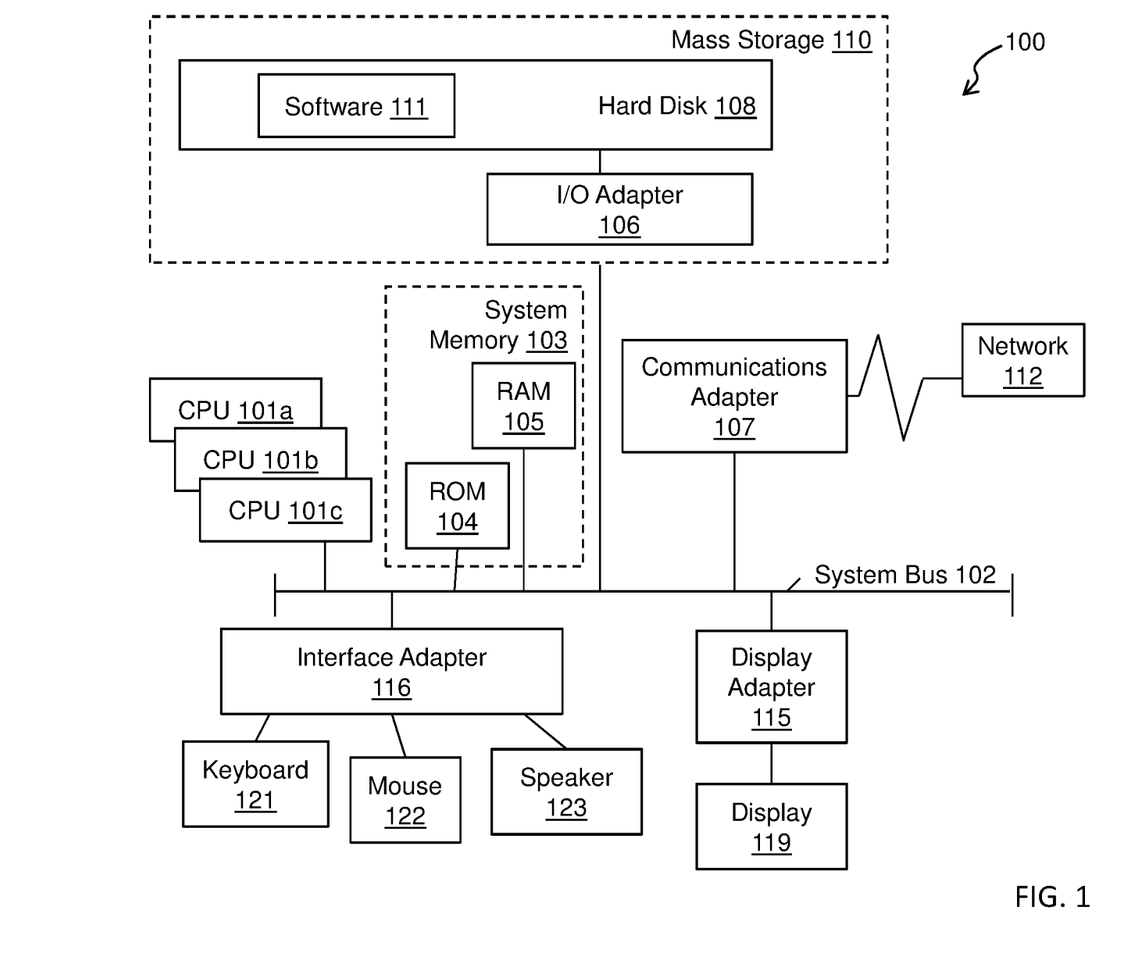
FIG. 1 is a block diagram of an example computer system.

Turning now to FIG. 1, a computer system 100 is generally shown in accordance with an embodiment. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others.

As shown in FIG. 1, the computer system 100 has one or more central processing units (CPU(s)) 101a, 101b, 101c, etc. (collectively or generically referred to as processor(s) 101). The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS), which controls certain basic functions of the computer system 100. The RAM is read-write memory coupled to the system bus 102 for use by the processors 101.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110. A software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein with reference to FIGS. 2-5. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, such as the z/OS or AIX operating system from IBM Corporation, to coordinate the functions of the various components shown in FIG. 1.

Additional input/output devices are shown as connected to the system bus 102 via a display adapter 115 and an interface adapter 116 and. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by a display adapter 115, which may include a graphics controller to improve the performance of graphics intensive applications and a video controller. A keyboard 121, a mouse 122, a speaker 123, etc. can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1.

Figure 2:
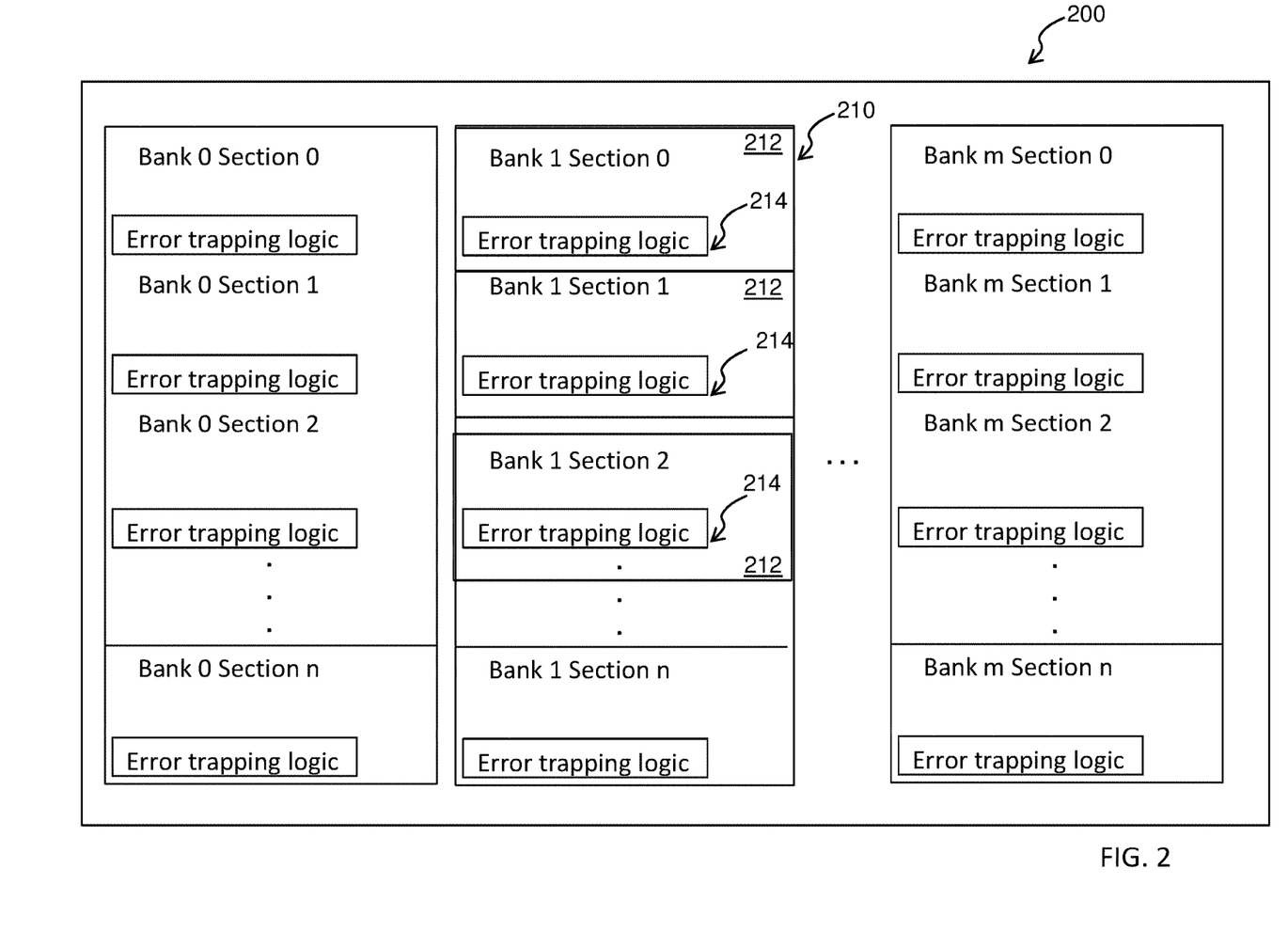
FIG. 2 is a block diagram of a memory device in accordance with an embodiment.

Turning now to FIG. 2, a memory structure 200 is generally shown in accordance with an embodiment. As illustrated, the memory structure 200 includes a plurality of memory banks 210 that each include a plurality of sections 212. In exemplary embodiments, each of the plurality of sections include an error trapping logic circuit 214. In one embodiment, the memory structure 200 is an L3 cache that has a total of sixteen banks 210, each with four sections 212, which results in sixty-four copies of error trapping logic 214 being included in the memory structure.

Figure 3A:
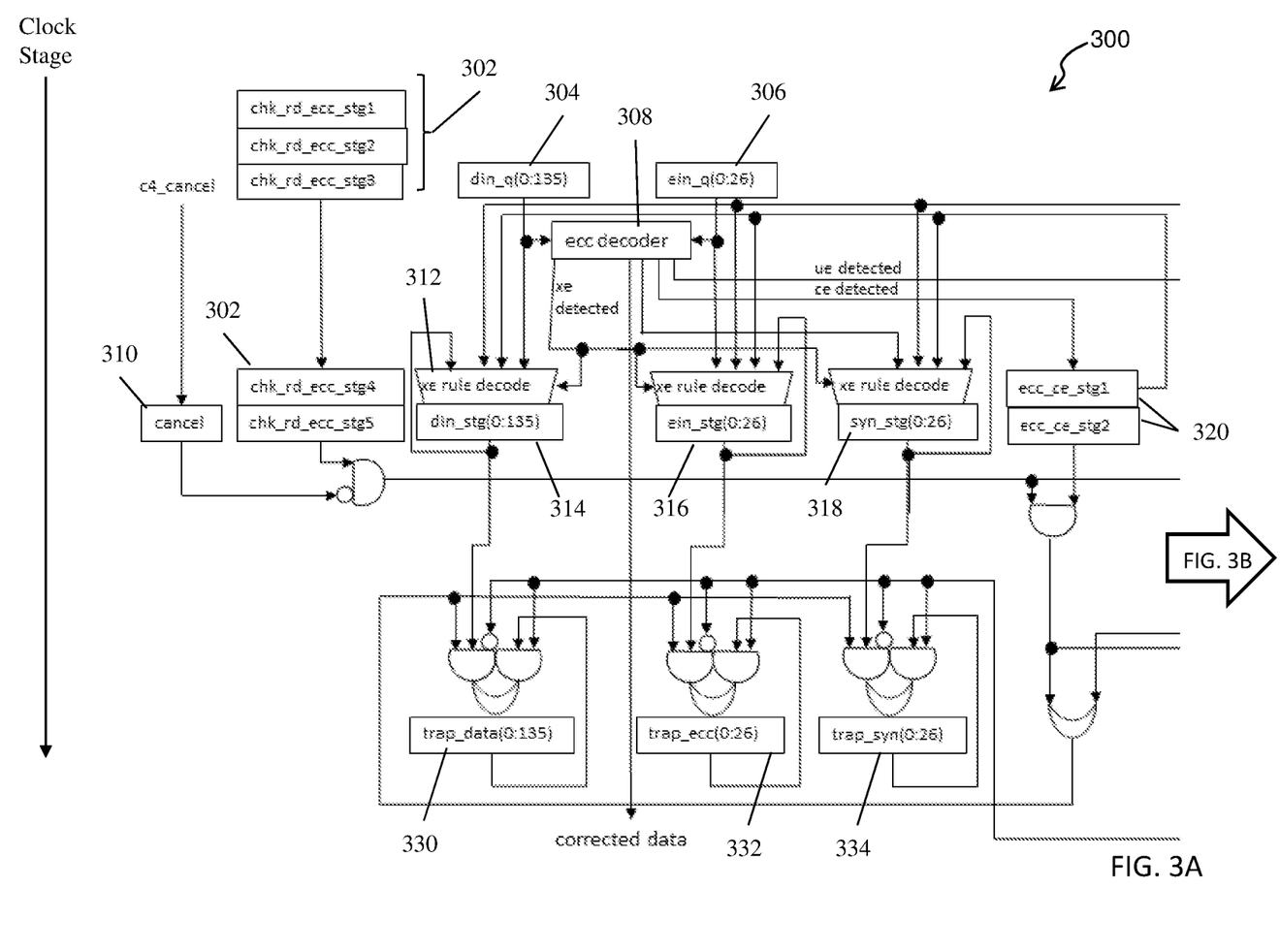
FIGS. 3A and 3B are block diagrams of an error trapping logic circuit in accordance with an embodiment.
Figure 3B:
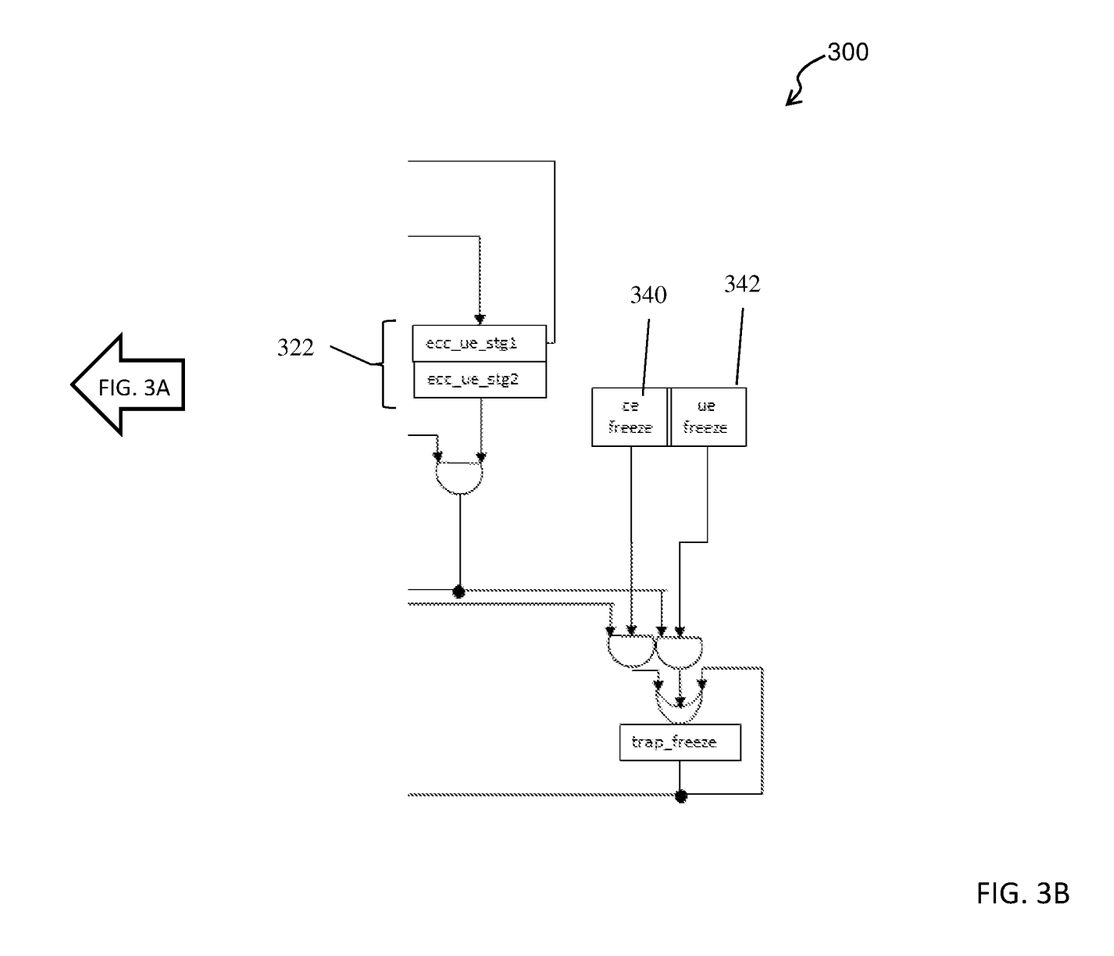

Turning now to FIGS. 3A and 3B, an error trapping logic circuit 300 is generally shown in accordance with an embodiment. As shown, the error trapping logic circuit 300 includes a plurality of logic gates, registers, and signals. It will be appreciated by those of ordinary skill in the art that the configuration of the error trapping logic circuit 300 depicted is illustrative in nature and that other configurations could be used to achieve the same or similar functionality. As shown, the error trapping logic circuit 300 includes a plurality of clock stages 302 (chk_rd_ecc_stg1 through chk_rd_ecc_stg5). Each clock stage is a subsequent clock cycle and the elements shown on the same level as the clock stages occur during that clock stage, or cycle. For example, a data input (din_q) and an error correction checkbits input (ein_q) are received from a memory location coincident with control information received in chk_rd_ecc_stg3 and stored in latches 304 and 306, respectively.

As illustrated, during clock stage 3, the ECC decoder 308 calculates an error syndrome from the data stored in latch 304 and ECC check bits stored in latch 306. The error syndrome is used for performing error correction, as well as providing information for later debug of errors that have occurred. In addition, the error syndrome generated by the ECC decoder 308 is provided into staging register 318 and to a set of multiplexers 312.

In exemplary embodiments, read data and error correction check bits are received in consecutive cycles to maximize throughput from the memory, and the read data and error correction check bits are stored in staging registers 314, 316 prior to error trapping. In exemplary embodiments, a hold path is created using a reduced set of staging registers. The hold path is used to retain information on any detected error condition until it is known if the read operation is legitimate, i.e. not canceled, which is not known until clock stage 5 when a c4_cancel signal is received at latch 310.

In exemplary embodiments, a set of trap registers 330, 332 and 334 utilize configuration registers 340 and 342 to determine whether the trap logic should freeze its contents when either a correctable or an uncorrectable error is detected. Since back-to-back errors on read data can occur, there is a need to decode the error type on the current cycle error in order to determine whether any previous cycle error should continue to be held in the set of staging registers, or whether it should be overwritten. However, the decoding of a correctable versus an uncorrectable error is a complex function that often is not able to be calculated during the same clock cycle in which the data and error correction check bits are received in time to determine holding or overwriting the contents of the set of staging registers.

In exemplary embodiments, it is not determined if a detected error is a correctable or uncorrectable error during the cycle in which the data and error correction code check bit data is received in time to determine holding or overwriting data, check bit and error syndrome staging registers. Rather, only a determination that an error exists is determined during the cycle in which the data and error correction code check bit data is received, by the ECC decoder 308. The ECC decoder 308 is configured to utilize a non-zero syndrome calculation, which is referred to as an xe decode. In exemplary embodiments, the xe decode indicates that either a correctable error or uncorrectable error occurred, but it is not known which type. The non-zero syndrome circuit for determining xe decode can simply be an OR of all of the syndrome bits, whereas determining the error type (correctable or uncorrectable) may involve a multiplicity of ECC matrix and compare operations on these same syndrome bits. This simpler xe decode calculation is completed in the same clock cycle in which the data and error correction check bits are received and used to determine whether or not to continue holding data in the set of staging registers 314, 316, 318. The correctable and uncorrectable error types are determined in time to latch into individual latches ecc_ce_stg1 320 and ecc_ue_stg1 322 respectively.

In exemplary embodiments, various logic gates are configured such that the error trapping logic circuit 300 follows a predetermined set of rules based on a current cycle xe decode and a determination of the type of error determined in a previous cycle (shown as correctable error (CE) detected and uncorrectable error (UE) detected).

In one embodiment, the trapping logic circuit 300 is configured to freeze on detection of an uncorrectable error. In this configuration, when a previous cycle uncorrectable error is followed by current cycle unknown error, the trapping logic circuit 300 is configured to prevent the unknown error from overwriting the uncorrectable error. However, in this configuration, when a previous cycle correctable error is followed by current cycle unknown error, the trapping logic circuit 300 is configured to allow the unknown error to overwrite the correctable error. The error held in the set of staging registers is then conditionally transferred to a set of trap registers based on whether or not the read operation is legitimate, or is canceled.

In another embodiment, the trapping logic circuit 300 is configured to freeze on detection of a correctable error. In this configuration, when a previous cycle correctable error is followed by current cycle unknown error, the trapping logic circuit 300 is configured to prevent the unknown error from overwriting the correctable error. However, in this configuration, when a previous cycle uncorrectable error is followed by current cycle unknown error, the trapping logic circuit 300 is configured to allow the unknown error to overwrite the uncorrectable error. The error held in the set of staging registers is then conditionally transferred to a set of trap registers based on whether or not the read operation is legitimate, or is canceled.

In another embodiment, the trapping logic circuit 300 is configured to freeze on detection of either a correctable error or uncorrectable error. In this configuration, when a previous cycle error, either correctable or uncorrectable, is followed by an unknown error, the trapping logic circuit 300 is configured to prevent the unknown error from overwriting the trapped error data. The error held in the set of staging registers is then conditionally transferred to a set of trap registers based on whether or not the read operation is legitimate, or is canceled.

In another embodiment, the trapping logic circuit 300 is not configured to freeze on detection of either a correctable error or uncorrectable error. In this configuration, the trapping logic circuit 300 is configured to allow the unknown error to overwrite the previously stored error data. The error held in the set of staging registers is then conditionally transferred to a set of trap registers based on whether or not the read operation is legitimate, or is canceled.

In one embodiment, the memory structure is an L3 cache that includes sixteen memory banks and four sets per bank. In this configuration, there are a total of sixty-four instances of the trap logic circuit. In one embodiment, the size of the data read is 135 bits and the check bits include 27 bits, with a syndrome size of 27 bits. By eliminating two sets of staging registers from each trap logic circuit, 378 latches can be removed, $(135+27+27)*2=378$. In addition, two CE and UE status register bits can also be eliminated, resulting in 380 latches removed per instance, or 24,320 latches for the entire L3 cache. In this embodiment, approximately 250 mW of power is saved through the latch removal.

Figure 4:
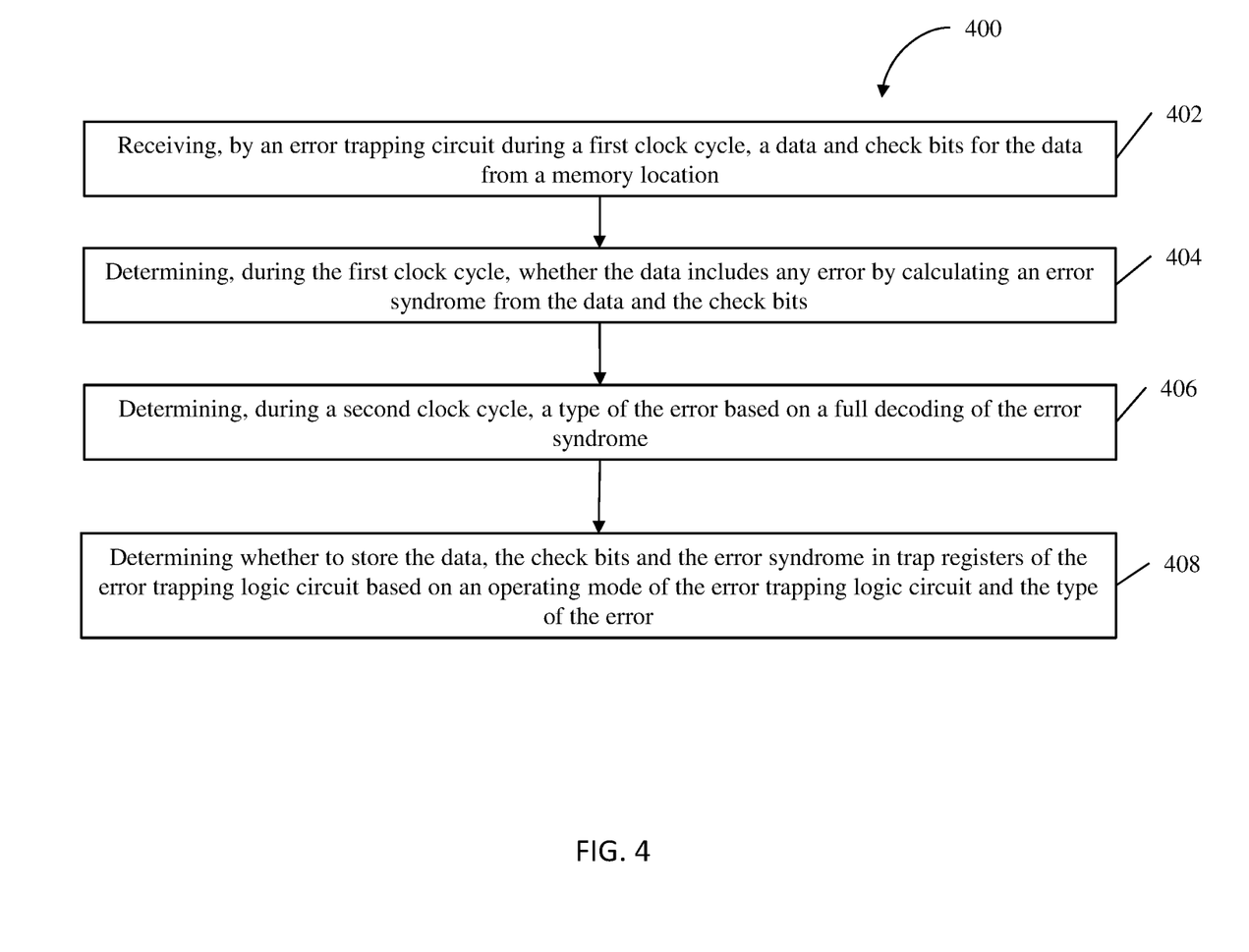
FIG. 4 is a process flow diagram of an example method for error trapping in a memory device.

FIG. 4 is a process flow diagram of an example method for operating an error trapping logic circuit in a memory device. The method 400 can be implemented within the memory of any suitable computing system, such as the computer system 100 of FIG. 1. As shown at block 402, the method 400 includes receiving, during a first clock cycle, data and check bits for the data from a memory location. The error check bits are the previously described ECC check bits. Next, as shown at block 404, the method 400 includes determining, during the first clock cycle, whether the data includes any error by calculating an error syndrome from the data and the check bits. In exemplary embodiments, the determination of whether the data includes an error does not include determining a type of the error, rather only the presence of an error. In exemplary embodiments, the presence of an error in the data is based on a determination that the error syndrome has a non-zero value. The method 400 includes determining, during a second clock cycle, a type of the error based on a full decoding of the error syndrome, as shown at block 406. In exemplary embodiments, the type of the error is determined to be one of a correctable error and an uncorrectable error. The second clock cycle is a clock cycle that immediately follows the first clock cycle.

The method 400 includes determining whether to store the data, the check bits and the error syndrome in trap registers of the error trapping logic circuit based on an operating mode of the error trapping logic circuit and the type of the error, as shown at block 408. In exemplary embodiments, the operating mode of the error trapping circuit is one of a correctable error freeze mode and a correctable error freeze mode. In one embodiment, a determination is made to store the data, the check bits and the error syndrome in trap registers based on determining that the type of the error is the correctable error and the operating mode is the correctable error freeze mode. In another embodiment, a determination is made to store the data, the check bits and the error syndrome in trap registers based on determining that the type of the error is the uncorrectable error and the operating mode is the uncorrectable error freeze mode.

In exemplary embodiments, the method also includes receiving a cancel signal and preventing the data, the check bits and the error syndrome from being stored in trap registers based upon receiving the cancel signal. In exemplary embodiments, the cancel signal is received after the second clock cycle.

Figure 5:
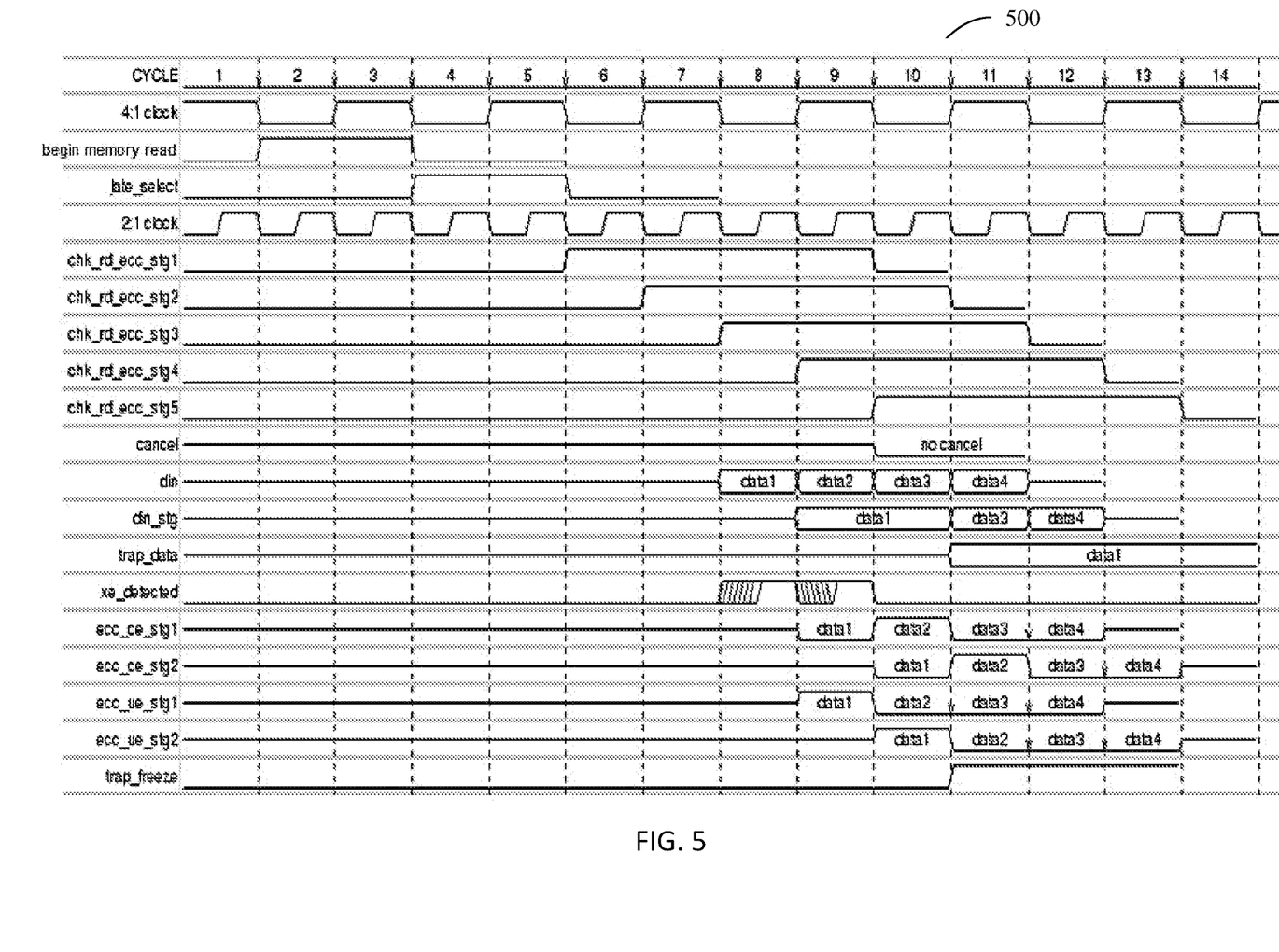
FIG. 5 is a timing diagram illustrating the operation of an error trapping logic circuit in accordance with an embodiment.

Referring now to FIG. 5, a timing diagram 500 illustrating the operation of an error trapping logic circuit 300 in accordance with an embodiment is shown. As illustrated, the memory access takes three 4:1 clock cycles and is started with the begin memory read in cycle 2. A late select occurs in a second 4:1 cycle in cycle 4 to select between internal banks inside the memory. The data access takes a third 4:1 cycle, and the data is latched in the first staging din register in cycle 8. Not shown is that ECC check bit data (ein) and error syndrome (syn) is latched and staged similar to the data. Four data beats are shown which occur in consecutive 2:1 clocks in cycles 8-11. Staging of control signals chk_rd_ecc_stg1-5 is also shown in cycles 6-10 corresponding to the first data beat. The shading shown for xe_detected indicates a delay for calculating the xe_detected signal due to combinatorial logic delay in the ECC decoder. This delay is short enough, however, to allow controlling the multiplexors in front of the din_stg, ein_stg and syn_stg latches using the rules previously described for preventing or allowing overwriting of data captured in these registers in the previous clock cycle. The UE and CE full decoding takes longer and is limited to driving the input to the ecc_ce_stg1 and ecc_ue_stg1 latches.

As shown in cycle 8, the xe_detected activates due to a UE present in data1. There is no previous cycle error, and so din_stg samples data1. In cycle 9, xe_detected activates due to the CE, but ecc_ue_stg1 is now active indicating that a UE was found on data beat 1. For this example, the trap logic is configured to trap on a first UE detected error. The XE rule decoding for a UE followed by XE prevents the XE from overriding the data in the din_stg register, and so data1 remains in the register for another cycle into cycle 10. In cycle 10, the state of cancel is known, as well as the UE indication in ecc_ue_stg2, and so the data1 is gated into the trap_data register for capture in cycle 11. The trap_freeze signal is also activated to prevent further sampling into the trap_data register. The timing diagram illustrates a UE followed by CE scenario where the logic is configured to trap and freeze on a first UE indication. Other combinations of CEs and UEs, and different configurations of freeze on CE or UE are allowed using the XE rules.

The present techniques may be a system, a method or an apparatus. The flowchart and block diagrams in the Figures illustrate the architecture, functionality, and operation of possible implementations of systems, methods, and apparatus according to various embodiments of the present techniques. In this regard, each block in the flowchart or block diagrams may represent a module, segment, or portion of logic for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for operating an error trapping logic circuit in a memory device, the method comprising:
   receiving, during a first clock cycle, data and check bits for the data from a memory location;
   determining, during the first clock cycle, whether the data includes any error by calculating an error syndrome from the data and the check bits;
   determining, during a second clock cycle, a type of the error based on a full decoding of the error syndrome;
   determining whether to store the data, the check bits and the error syndrome in trap registers of the error trapping logic circuit based on an operating mode of the error trapping circuit and the type of the error; and
   preventing the data, the check bits and the error syndrome from being stored in trap registers based upon receiving a cancel signal, wherein the cancel signal is received after the second clock cycle.

2. The computer-implemented method of claim 1, wherein the type of the error is determined to be one of a correctable error and an uncorrectable error.

3. The computer-implemented method of claim 2, wherein the operating mode of the error trapping logic circuit is one of a correctable error freeze mode and an uncorrectable error freeze mode.

4. The computer-implemented method of claim 3, wherein a determination is made to store the data, the check bits and the error syndrome in trap registers based on determining that the type of the error is the correctable error and the operating mode is the correctable error freeze mode.

5. The computer-implemented method of claim 3, wherein a determination is made to store the data, the check bits and the error syndrome in trap registers based on determining that the type of the error is the uncorrectable error and the operating mode is the uncorrectable error freeze mode.

6. The computer-implemented method of claim 1, wherein the determination made during the first clock cycle of whether the data includes any error is based on a determination that the error syndrome has a non-zero value.

7. The computer-implemented method of claim 1, wherein the second clock cycle is a clock cycle that immediately follows the first clock cycle.

8. A memory device comprising:
   a plurality of memory banks each comprising a plurality of memory sections configured to store data, each of the plurality of memory sections having an error trapping logic circuit that is configured to:
   receive, during a first clock cycle, data and check bits for the data from a memory location;

determine, during the first clock cycle, whether the data includes any error by calculating an error syndrome from the data and the check bits;

determine, during a second clock cycle, a type of the error based on a full decoding of the error syndrome; and determine whether to store the data, the check bits and the error syndrome in trap registers of the error trapping logic circuit based on an operating mode of the error trapping logic circuit and the type of the error; and prevent the data, the check bits and the error syndrome from being stored in trap registers based upon receiving a cancel signal, wherein the cancel signal is received after the second clock cycle.

9. The memory device of claim 8, wherein the type of the error is determined to be one of a correctable error and an uncorrectable error.

10. The memory device of claim 9, wherein the operating mode of the error trapping logic circuit is one of a correctable error freeze mode and an uncorrectable error freeze mode.

11. The memory device of claim 10, wherein a determination is made to store the data, the check bits and the error syndrome in trap registers based on determining that the type of the error is the correctable error and the operating mode is the correctable error freeze mode.

12. The memory device of claim 10, wherein a determination is made to store the data, the check bits and the error syndrome in trap registers based on determining that the type of the error is the uncorrectable error and the operating mode is the uncorrectable error freeze mode.

13. The memory device of claim 8, wherein the determination made during the first clock cycle of whether the data includes any error is based on a determination that the error syndrome has a non-zero value.

14. The memory device of claim 8, wherein the second clock cycle is a clock cycle that immediately follows the first clock cycle.

15. An error trapping logic circuit that is configured to:
receive, during a first clock cycle, data and check bits for the data from a memory location;

determine, during the first clock cycle, whether the data includes any error by calculating an error syndrome from the data and the check bits;

determine, during a second clock cycle, a type of the error based on a full decoding of the error syndrome;

determine whether to store the data, the check bits and the error syndrome in trap registers of the error trapping logic circuit based on an operating mode of the error trapping logic circuit and the type of the error; and prevent the data, the check bits and the error syndrome from being stored in trap registers based upon receiving a cancel signal, wherein the cancel signal is received after the second clock cycle.

16. The error trapping logic circuit of claim 15, wherein the type of the error is determined to be one of a correctable error and an uncorrectable error.

17. The error trapping logic circuit of claim 16, wherein the operating mode of the error trapping logic circuit is one of a correctable error freeze mode and an uncorrectable error freeze mode.

18. The error trapping logic circuit of claim 17, wherein a determination is made to store the data, the check bits and the error syndrome in trap registers based on determining that the type of the error is the correctable error and the operating mode is the correctable error freeze mode.

* * * * *